US011699989B2

(12) United States Patent
Bhave et al.

(10) Patent No.: US 11,699,989 B2
(45) Date of Patent: *Jul. 11, 2023

(54) IN-PLANE AND OUT-OF-PLANE DISK RESONATOR

(71) Applicant: Purdue Research Foundation, West Lafayette, IN (US)

(72) Inventors: Sunil A Bhave, West Lafayette, IN (US); Pen-Li Yu, San Jose, CA (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/980,495

(22) Filed: Nov. 3, 2022

(65) Prior Publication Data
US 2023/0054876 A1 Feb. 23, 2023

Related U.S. Application Data

(63) Continuation of application No. 16/545,554, filed on Aug. 20, 2019, now Pat. No. 11,496,115.

(51) Int. Cl.
*H03H 9/17* (2006.01)
*H03H 9/13* (2006.01)

(52) U.S. Cl.
CPC ............ *H03H 9/178* (2013.01); *H03H 9/132* (2013.01)

(58) Field of Classification Search
CPC .... H03H 9/178; H03H 9/132; H03H 9/02062; H03H 9/17; H03H 9/02015
See application file for complete search history.

(56) References Cited

U.S. PATENT DOCUMENTS 11,496,115 B2 * 11/2022 Bhave ................ H03H 9/02015

* cited by examiner

*Primary Examiner* — Jeffrey M Shin
(74) *Attorney, Agent, or Firm* — Piroozi-IP, LLC

(57) ABSTRACT

A piezoelectric structure is disclosed which includes a single crystal having piezoelectric coefficients $d_{31}$ and $d_{32}$ of opposite magnitude, such that when an alternating electric field is applied in the Z direction, the piezoelectric structure expands in one of the X and Y directions and contracts in the other of the X and Y direction, a first electrode coupled to the single crystal, and a second electrode coupled to the single crystal, wherein the alternating electric field is input to the single crystal through the first and second electrodes.

18 Claims, 12 Drawing Sheets

IN-PLANE AND OUT-OF-PLANE DISK RESONATOR

CROSS-REFERENCE TO RELATED APPLICATIONS

The present patent application is a continuation of U.S. Non-Provisional patent application Ser. No. 16/545,554 filed on 20 Aug. 2019, the contents of which are hereby incorporated by reference in its entirety into the present disclosure.

STATEMENT REGARDING GOVERNMENT FUNDING

This invention was not made with government support.

TECHNICAL FIELD

The present disclosure generally relates to piezoelectric resonators, and in particular, to single crystal disk resonators with a novel transduction mechanism.

BACKGROUND

This section introduces aspects that may help facilitate a better understanding of the disclosure. Accordingly, these statements are to be read in this light and are not to be understood as admissions about what is or is not prior art.

Piezoelectric resonators are ubiquitous in a variety of different fields spanning from energy harvesters to engine knock sensors to ultrasonic cleaners. The basic operational theory behind piezoelectric transducers is based on conversion of electrical energy to mechanical energy in the form of vibration when an electrical signal is applied to the transducer, or based on conversion of mechanical energy in the form of vibration to electrical energy. In the latter modality, Piezoelectric transducers do not require external power, which makes them an ideal sensor/transducer in many applications, some of which mentioned above. In addition, piezoelectric sensors/transducers are highly responsive to high-frequency input. However, these sensors generate small amounts of electric charge. As such these devices have not seen the full potential of the conversion between mechanical energy and electrical energy. Towards this end many have tried to improve the efficiency of the piezoelectric transducers by increasing charge generated per unit amount of mechanical energy, or by generating mechanical displacement for a unit of charge that is input to the transducer.

Micromachined gyroscopes have applications ranging from inertial navigation to camcorder image stabilization. The gyroscope relies on two vibration modes, the drive-mode and the sense-mode. The drive mode vibrates at a large amplitude while the sense mode is at rest when there is no rotation. When the gyroscope is rotated, the Coriolis force couples the modes and the drive-mode excites the sense-mode. The sense-mode vibration amplitude is measured to detect the angular velocity. The signal to noise ratio is proportional to the amplitude of the drive mode and inverse proportional to the noise motion of the sense mode. Ideally, the drive- and sense-mode are perfectly orthogonal. In real devices, the sense mode may have motion at rest due to non-ideal coupling between the drive- and sense-mode. This error, quadrature error, is an important limit of micromachined gyroscope performance.

What is needed, is therefore a transduction mechanism that strongly couples to the drive mode and immunize to the quadrature error.

SUMMARY

A piezoelectric structure is disclosed which includes a single crystal having piezoelectric coefficients $d_{31}$ and $d_{32}$ of opposite magnitude, such that when an alternating electric field is applied in the Z direction, the piezoelectric structure expands in one of the X and Y directions and contracts in the other of the X and Y direction, a first electrode coupled to the single crystal, and a second electrode coupled to the single crystal, wherein the alternating electric field is input to the single crystal through the first and second electrodes.

Another piezoelectric structure is also disclosed, which includes a substrate, a single crystal having piezoelectric coefficients $d_{31}$ and $d_{32}$ of opposite magnitude formed on the substrate, such that when an alternating electric field is applied in the Z direction, the piezoelectric structure expands in one of the X and Y directions and contracts in the other of the X and Y direction, thereby generating torque resulting in displacement in the Z direction, a first electrode coupled to the single crystal, and a second electrode coupled to the single crystal, wherein the alternating electric field is input to the single crystal through the first and second electrodes.

DETAILED DESCRIPTION

Figure 1:
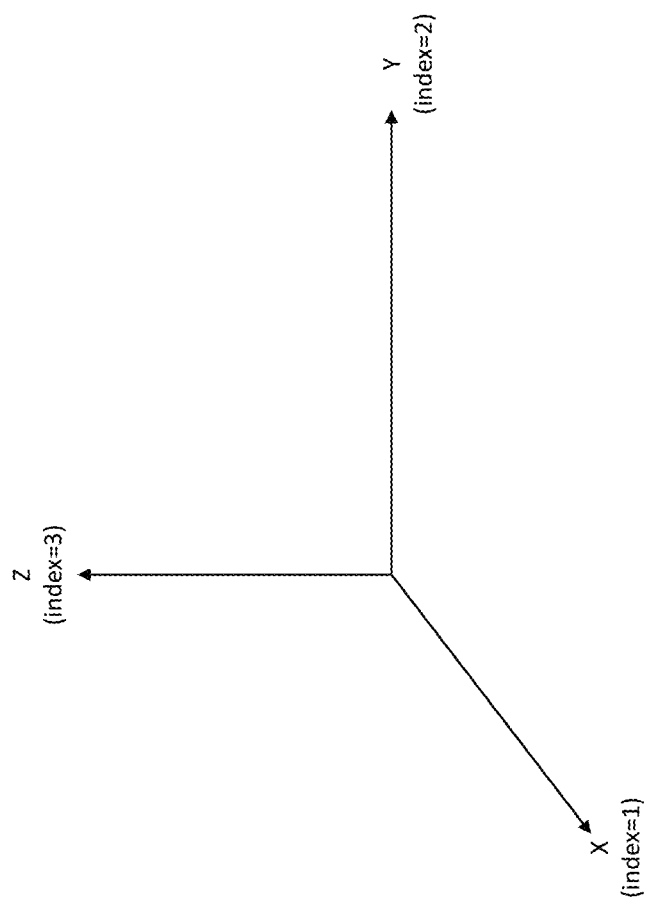
FIG. 1 is a schematic of a Cartesian Coordinate System showing indexes used in the present disclosure.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

Novel approaches to improve efficiency of a piezoelectric transducer by providing different modalities of displacement are provided in the present disclosure to thereby improve mechanical displacement caused by inputting unit charge into the transducer.

A piezoelectric transducer made up of single crystal Pb(Mg$_{1/3}$Nb$_{2/3}$)O$_3$-PbTiO$_3$ (PMN-PT) with <011> orientation possesses a piezoelectric coefficient of d$_{31}$ of between about 1 and about 2000 pm/V and d$_{32}$ of between about 1 to about −3500 pm/V. In one embodiment, d$_{31}$ is about 921 pm/V and d$_{32}$ is about −1883 pm/V. The notation for the coefficients is described.

Referring to FIG. 1, a cartesian coordinate system is shown with axes XYZ. The indexes 1, 2, and 3 are corresponding to X, Y, and Z direction. Therefore, a piezoelectric coefficient d$_{31}$ represents an electric field in the Z direction with displacement measured in the X direction. Similarly, a piezoelectric coefficient d$_{32}$ represents an electric field in the Z direction with displacement measured in the Y direction. Given the values provided above, according to one embodiment, two observations can be made: 1) the coefficients are extremely large (e.g., about 200 times higher than aluminum nitride, a standard-bearer of piezoelectric), and 2) the coefficients have opposite signs. The latter means for the same electric field excitation in the Z direction, the crystal changes in one fashion in the X direction and in an opposite fashion in the Y direction. On application of an E-electric field in the Z direction, the disk resonator according to the present disclosure will expand outwards along the X-axis, while simultaneously squeeze inwards along the Y-axis. This unique stress field set up by the positive d$_{31}$ coefficient generates a strong coupling along the X-Y axes to thereby establish a wineglass mode of resonating/displacing disk along the X-Y axis.

Figure 2A:
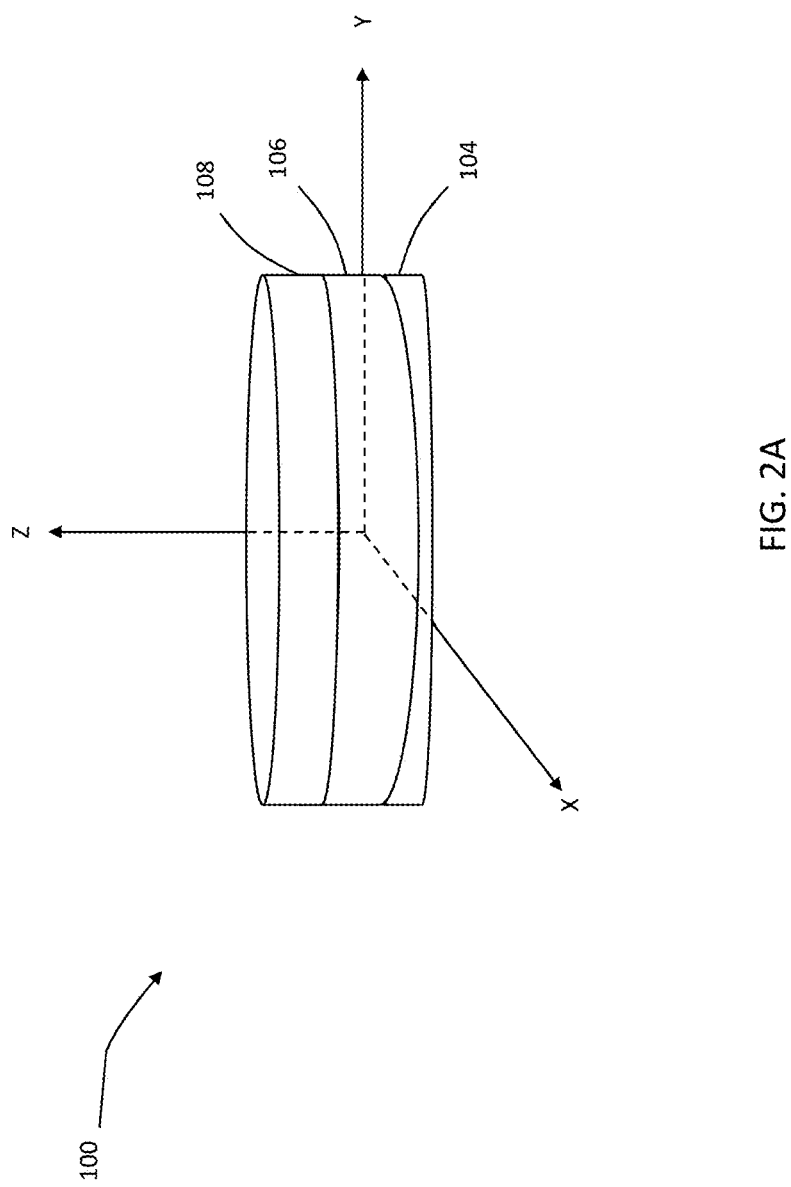
FIG. 2A is a schematic of a disk-shape single crystal with electrodes disposed on top and bottom, according to one embodiment of the present disclosure.
Figure 2B:
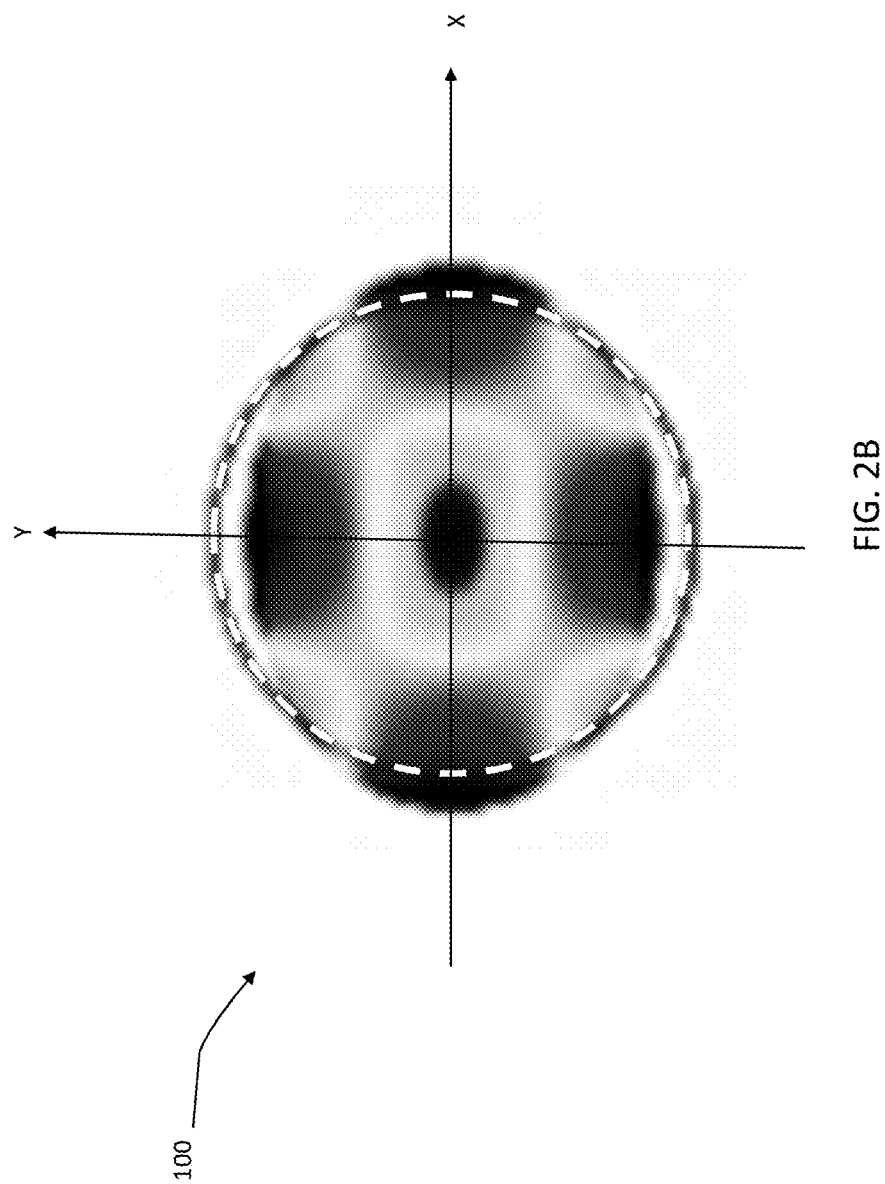
FIG. 2B is an illustration of lateral displacement of the single crystal of FIG. 2A when an alternating electric field is applied.

Referring to FIG. 2A, a perspective view of a first PMN-PT disk resonator stack 100, according to the present disclosure, is shown. With an electric field applied in the Z direction, strong coupling in X and Y directions can be realized. Referring to FIG. 2B, a top view of the disk resonator stack 100 is shown under the application of the electric field in the Z direction. The dashed line circle represents the disk prior to energization.

The PMN-PT disk resonator stack 100 of FIG. 2A includes several layers as described below.

The PMN-PT disk resonator stack 100 includes a first electrode 104. The first electrode 104 may include various conductive materials, known to a person having ordinary skill in the art compatible with semiconductor processes. Examples of the electrode 104 include metals including tungsten (W), molybdenum (Mo), aluminum (Al), platinum (Pt), ruthenium (Ru), niobium (Nb), or hafnium (Hf), or the like.

The PMN-PT disk resonator stack 100 also includes a PMN-PT disk resonator layer 106. The PMN-PT disk resonator layer 106 includes PMN-PT as discussed above.

The PMN-PT disk resonator stack 100 also includes a second electrode 108. The electrode 108 may include various conductive materials, known to a person having ordinary skill in the art compatible with semiconductor processes. Examples of the electrode 108 include metals including tungsten (W), molybdenum (Mo), aluminum (Al), platinum (Pt), ruthenium (Ru), niobium (Nb), or hafnium (Hf), or the like.

Figure 3:
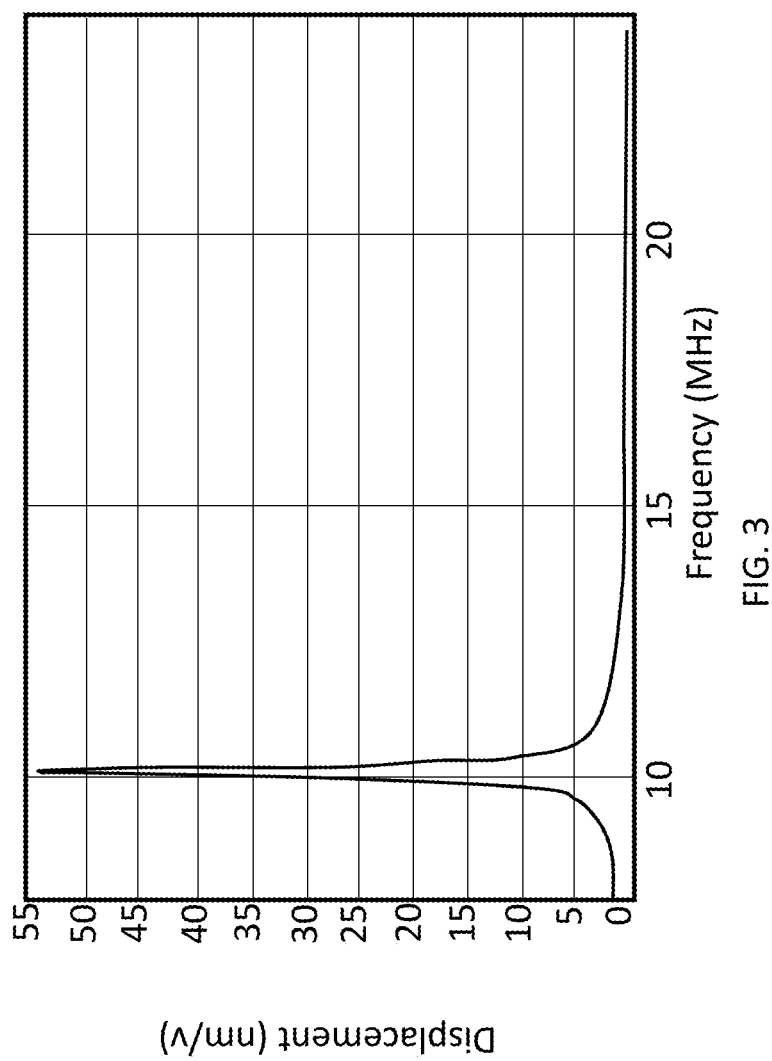
FIG. 3 is a graph of displacement in nm/v vs. frequency in MHz of the single crystal of FIG. 2A.

When the electric field is applied, the disk 100 expands in the X direction while contracting in the Y direction, owing to piezoelectric coefficient having opposite values (i.e., one coefficient positive and one coefficient negative). Referring to FIG. 3, a graph of admittance vs. tip-displacement for 1 Volt sinusoidal drive is shown. The disk is a PMN-PT disk with a diameter that ranges from about 10 µm to about 200 µm and a thickness that ranges between about 1 µm and about 10 µm. The disk used to generate the graph was a PMN-PT disk a radius of about 65 µm, a thickness of about 10 µm, which yields a dielectric loss of about 0.01, and a mechanical damping of about 0.01.

The dielectric loss is defined as:

$$\tan\delta = \frac{\varepsilon_r''}{\varepsilon_r'},$$

where
the dielectric constant is defined as:

$\varepsilon_r = \varepsilon_r' - j\varepsilon_r''$, where $\varepsilon_r$ is the dielectric constant which is a complex number including:
$\varepsilon_r'$ as the real component, and
$\varepsilon_r''$ as the imaginary component. If the piezoelectric is modeled as a capacitor with a lossy dielectric, the capacitance is identified as:

$$C = \frac{\varepsilon_0 \varepsilon_r A}{d},$$

where
$\varepsilon_0$ is the dielectric constant of free space,
$\varepsilon_r$ is the complex dielectric constant discussed above,
A is the area, and
d is the thickness. Impedance is thus defined as:

$$z = \frac{1}{j\omega C},$$

where
$\omega = 2\pi f$, where f is the frequency, and admittance is defined as:
Y=1/Z. The mechanical damping is also a complex number and it represents inherent properties by which energy is dissipated during oscillation. With mechanical Q of 100, a tip displacement of 55 nm for 1 V sine wave input can be realized. More importantly even at about 20% off resonance, a 5 nm displacement for 1 V sine-wave can still be achieved.

The first and second electrodes of the piezoelectric structures of FIG. 2A is configured to be shaped as one of i) disk-shaped electrodes of substantially the same diameter as the disk-shaped single crystal, or ii) semicircular-shaped electrodes of substantially ½ diameter as the disk-shaped single crystal.

Figure 4A:
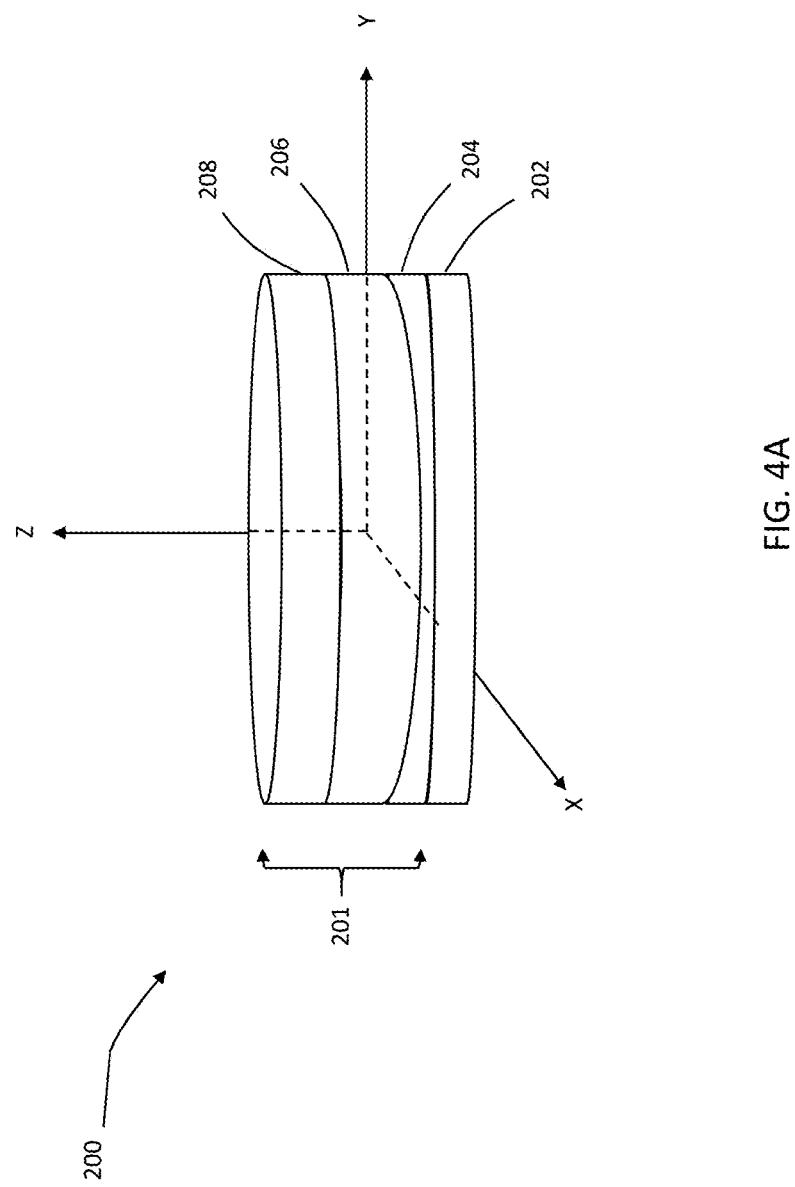
FIG. 4A is a schematic of a disk-shape single crystal with electrodes disposed on top and bottom and a substrate disposed on one electrode, according to a second embodiment of the present disclosure.

The in-plane mode described above, results in mechanical vibration of the disk in the X and Y directions. Additionally, the present disclosure provides a mode in which the mechanical vibration occurs in all three directions (X, Y, and Z). Referring to FIG. 4A, a perspective view of a second PMN-PT disk resonator stack 200, according to the present disclosure, is shown. The resonator stack 200 includes a PMN-PT disk resonator assembly 201 formed atop a substrate 202. The substrate 202 may include various types of semiconductor materials known to a person having ordinary skill in the art compatible with semiconductor processes. Examples of the substrate 202 includes silicon (Si), gallium arsenide (GaAs), indium phosphide (InP), sapphire, glass, or the like. On application of an E-electric field in the Z direction, the disk resonator stack 200, according to the present disclosure, will, for example, expand outwards along the Y-axis, while simultaneously squeeze inwards along the X-axis, as well as a positive Z-direction displacement along the Y-axis and a negative Z-direction displacement along the X-axis. This unique stress field set up by the positive $d_{31}$ coefficient generates a strong coupling along the X-Y axes to thereby establish a "out-of-plane flexural wineglass mode" mode of resonating/displacing disk along the X-Y-Z axes.

The PMN-PT disk resonator assembly 201 also includes a first electrode 204. The first electrode 204 may include various conductive materials, known to a person having ordinary skill in the art compatible with semiconductor processes. Examples of the electrode 204 include metals including tungsten (W), molybdenum (Mo), aluminum (Al), platinum (Pt), ruthenium (Ru), niobium (Nb), or hafnium (Hf), or the like.

The PMN-PT disk resonator assembly 201 also includes a PMN-PT disk resonator 206. The PMN-PT disk resonator 206 includes PMN-PT as discussed above.

Figure 4B:
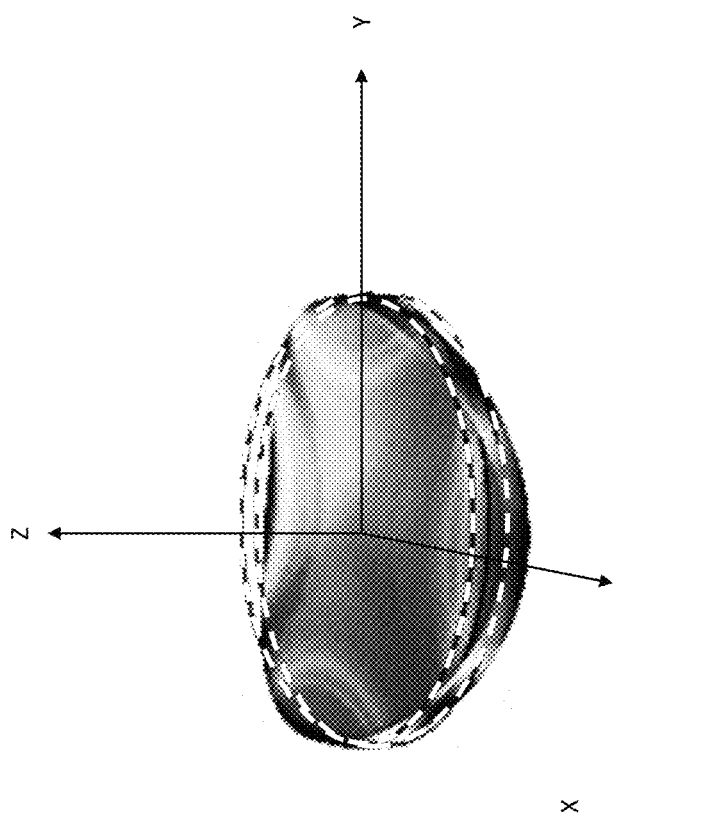
FIG. 4B is an illustration of lateral displacement as well as displacement in the Z-direction of the single crystal of FIG. 4A when an alternating electric field is applied.
Figure 5:
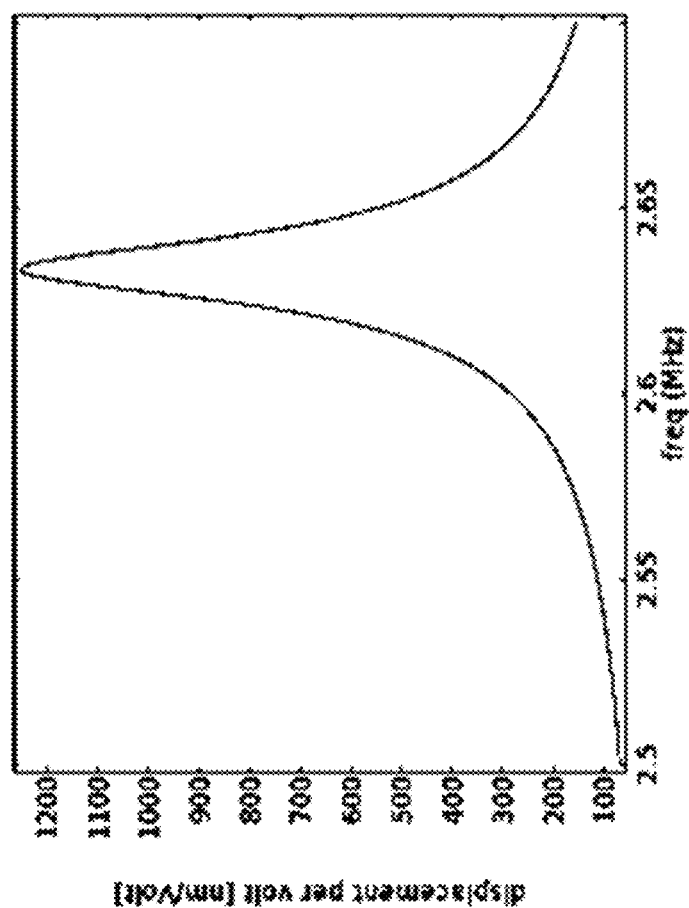
FIG. 5 is a graph of displacement in nm/v vs. frequency in MHz of the single crystal of FIG. 4A.

The PMN-PT disk resonator stack assembly 201 also includes a second electrode 208. The second electrode 208 may include various conductive materials, known to a person having ordinary skill in the art compatible with semiconductor processes. Examples of the electrode 208 include metals including tungsten (W), molybdenum (Mo), aluminum (Al), platinum (Pt), ruthenium (Ru), niobium (Nb), or hafnium (Hf), or the like The bonding between the PMN-PT disk resonator assembly 201 to a non-piezoelectric carrier material such as the substrate 202, e.g., silicon, will not only excite the in-plane vibration modes, but the unimorph construction of the resonator will generate an out-of-plane torque. The torque results in vibration in the Z-direction. This results in strong coupling to the out-of-plane bending, as shown in FIG. 4B. The PMN-PT-on-substrate resonator configuration also couples to the in-plane vibration mode discussed previously but at a higher frequency. Referring to FIG. 4B, a perspective view of the disk 200 is shown under the application of the electric field in the Z direction. The dashed line circles represents the disk prior to energization. When the electric field is applied, the disk 200 expands in the X direction while contracting in the Y direction, owing to piezoelectric coefficient having opposite values (i.e., one coefficient positive and one coefficient negative). The bonded substrate causes displacement in the Z-direction owing to a generated torque. Referring to FIG. 5, a graph of admittance vs. tip-displacement for 1 Volt sinusoidal drive is shown. The disk used to generate the graph was a PMN-PT disk has a diameter that ranges between about 10 µm and about 200 µm and a thickness that ranges between about 1 µm and about 10 µm. The disk possesses a piezoelectric coefficient of $d_{31}$ of between about 1 and about 2000 pm/V and $d_{32}$ of between about 1 to about −3500 µm/V. In one embodiment, $d_{31}$ is about 921 µm/V and $d_{32}$ is about 1 to about −1883 pm/V. According to one embodiment, the radius is about 65 µm, the thickness of about 5 µm, and the silicon substrate has a thickness of about 5 nm.

While the present disclosure has concentrated on PMN-PT, it should be appreciated the teachings of the present disclosure are applicable to all structures with large $d_{31}$ and $d_{32}$ of opposite signs.

In addition, while only a disk is described in the present disclosure, other shapes, e.g., shapes with cross-sections of square, rectangle, diamond, polygon, elliptical, and wheel-shaped are also within the scope of the present disclosure.

Figure 6A:
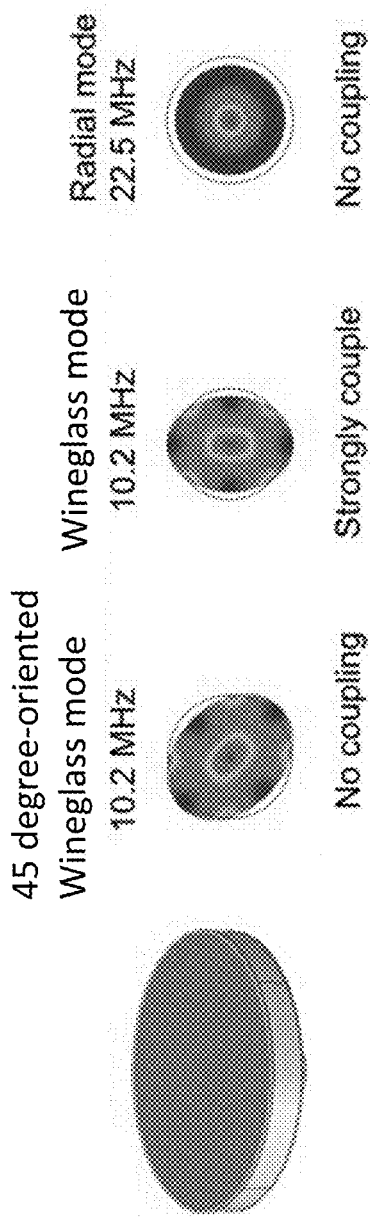
FIG. 6A is a graphical representation of a displacement of the resonator of FIG. 2A depicting modes called herein as wineglass modes and fundamental radial modes.
Figure 6B:
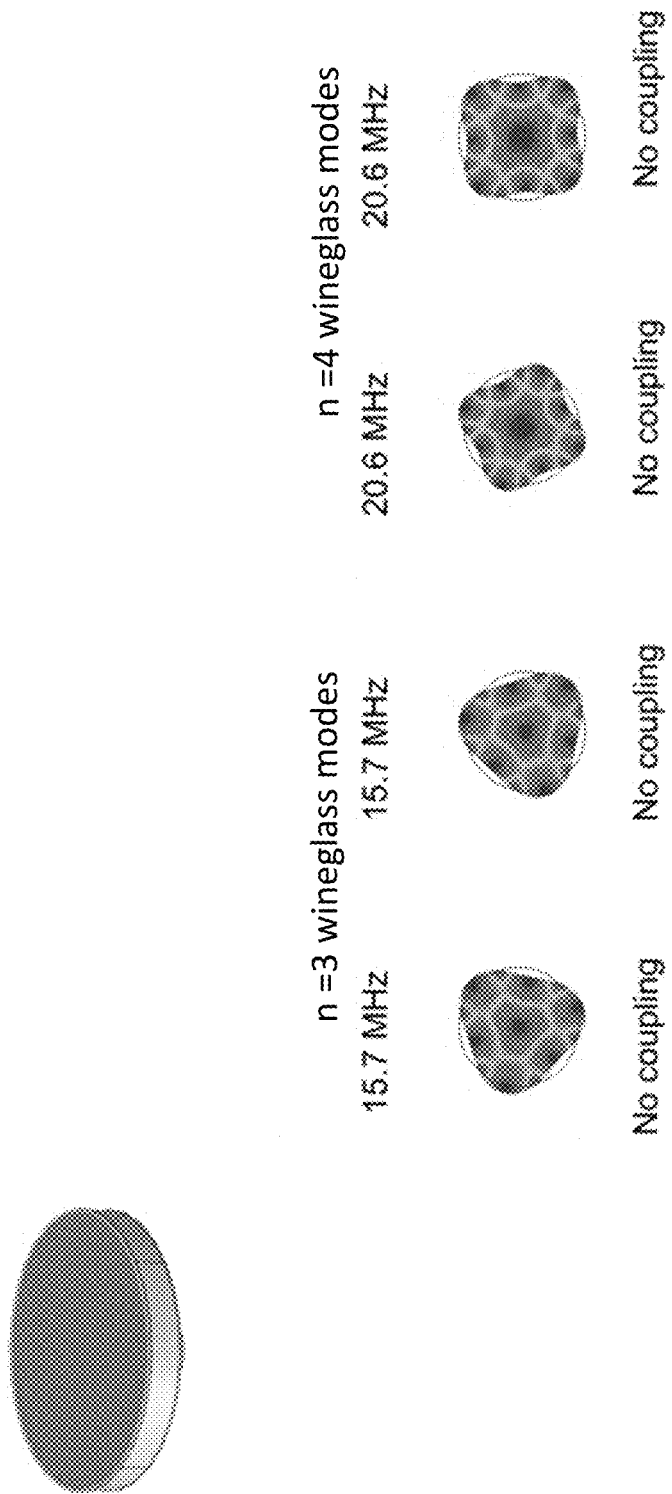
FIG. 6B is a graphical representation of displacement of the resonator of FIG. 2A depicting higher order wineglass modes.
Figure 7:
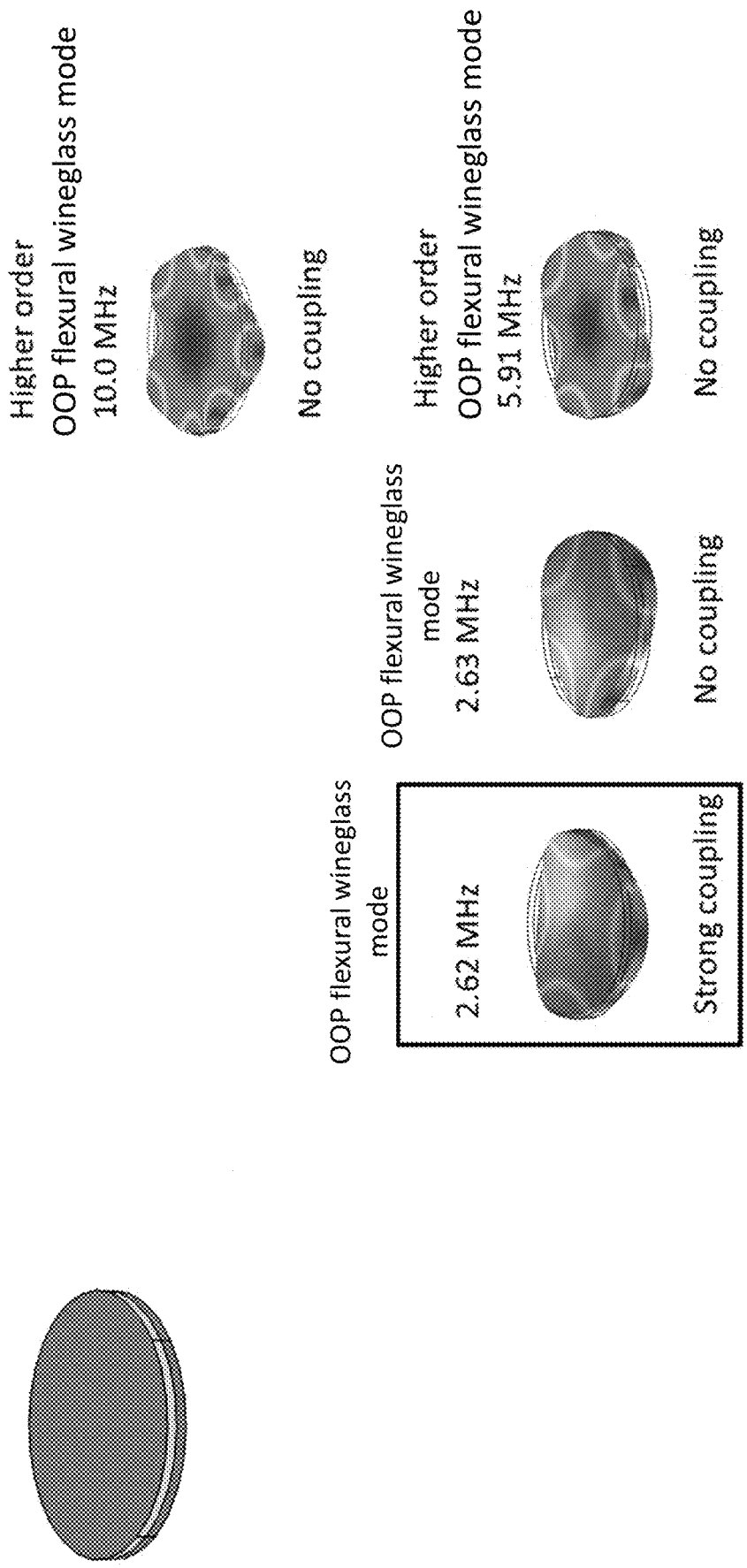
FIG. 7 shows graphical representations of displacement of the resonator of FIG. 4A depicting modes called herein as out-of-plane (OOP) flexural wineglass modes.

It should be appreciated that the PMN-PT resonator that is not attached to the substrate (see FIG. 2A), according to the present disclosure, is governed by the wineglass mode which includes a primary mode (i.e., about a 0-degree oriented mode) and a degenerate mode, (i.e., about a 45-degree oriented mode). The PMN-PT resonator couples to the primary mode but the PMN-PT resonator does not couple to the degenerate mode (see, e.g., first mode of 10.2 MHz shown in FIG. 6A) and higher order wineglass modes (four modes shown in FIG. 6B). These figures (FIGS. 6A and 6B) show the family of mechanical modes for a disk resonator and the mechanical stress field of each mode. FIGS. 6A and 6B represent a resonator with an anchor at the center-bottom (see below for a discussion of anchors). The same statement can be made for the PMN-PT on substrate resonator (See FIG. 4A). That is, the PMN-PT resonator stack 200 according to the present disclosure, is governed by the out-of-plane flexural wineglass mode, which includes a primary mode (i.e., about a 0-degree oriented mode) and a degenerate mode (i.e., about a 45-degree oriented mode). The PMN-PT stack 200 couples to the primary mode (see first out-of-plane flexural wineglass mode in FIG. 7) but the PMN-PT resonator stack 200 does not couple to the degenerate mode and higher order modes (see other modes in FIG. 7). FIG. 7 shows modes with respect to a resonator with an anchor at the center-bottom (see below for a discussion of anchors).

Figure 8B:
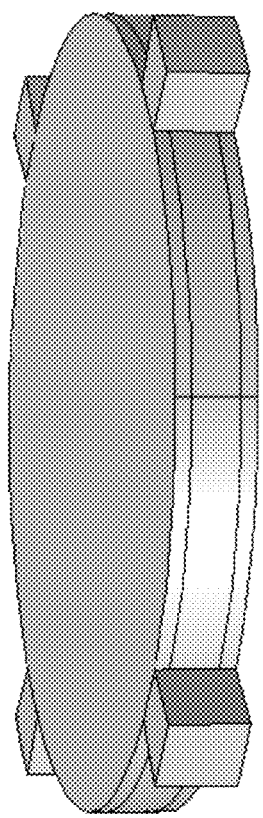
FIGS. 8A, 8B, 8C, and 8D show schematic representation of anchors coupled to the resonators of the present disclosure (FIGS. 8A-8C represent resonator of FIG. 2A and FIG. 8D represent the resonator of FIG. 4A), where anchors are disposed i) center-axially, ii) on the perimeter, and iii) a combination of i) and ii).
Figure 8A:
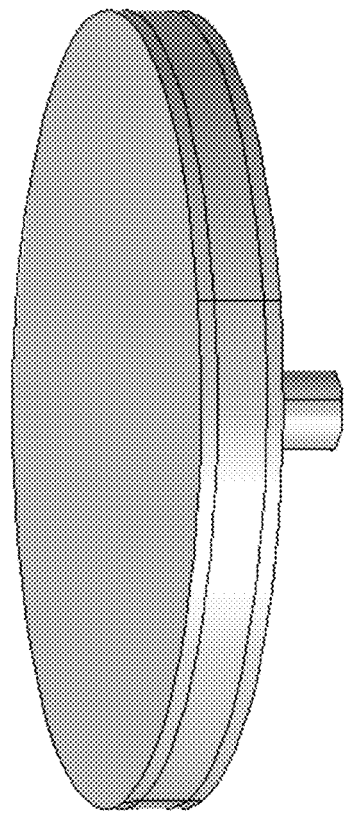
Figure 8D:
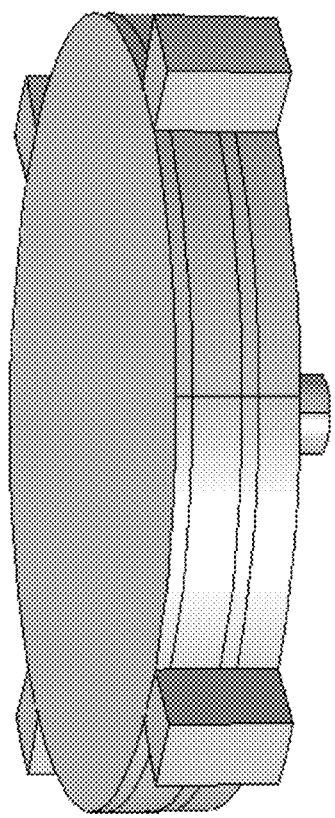
Figure 8C:
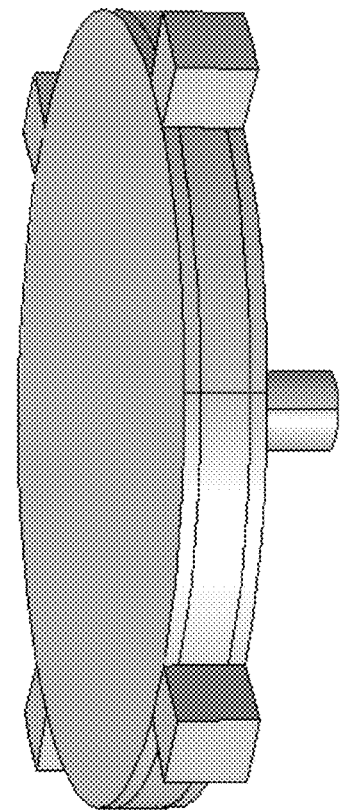

It should also be appreciated that resonators of the present disclosure can be modified to have anchors. These anchors can be disposed about the center-bottom or at perimeter of the resonator. These variations are shown in FIGS. 8A and 8B for the resonator without a substrate attachment (see FIG. 2A). A combination of these anchors is shown in FIG. 8C. FIG. 8D shows the same combination for the resonator with substrate (see FIG. 4A).

Those having ordinary skill in the art will recognize that numerous modifications can be made to the specific implementations described above. The implementations should not be limited to the particular limitations described. Other implementations may be possible.

The invention claimed is:
1. A piezoelectric structure, comprising:
a single crystal having piezoelectric coefficients $d_{31}$ and $d_{32}$ of opposite magnitude, such that when an alternating electric field is applied in the Z direction, the piezoelectric structure expands in one of the X and Y directions and contracts in the other of the X and Y direction, with substantially zero displacement in the Z-direction;
a first electrode coupled to the single crystal; and
a second electrode coupled to the single crystal, wherein the alternating electric field is input to the single crystal through the first and second electrodes, and wherein the single crystal possesses piezoelectric coefficient $d_{31}$ of between about 1 pm/V and about 2500 pm/V and piezoelectric coefficient $d_{32}$ of between about −1 pm/V and −3500 pm/V.

2. The piezoelectric structure of claim 1, the single crystal is disk-shaped.

3. The piezoelectric structure of claim 2, the disk-shaped single crystal has a diameter of between about 10 μm and about 200 μm and a thickness of between about 1 μm and about 10 μm.

4. The piezoelectric structure of claim 1, further comprising one or more anchors disposed i) center-axially coupled to one of the first or second electrodes; ii) radially about the perimeter; or iii) a combination of i) and ii).

5. The piezoelectric structure of claim 3, wherein the first and second electrodes are shaped as one of i) disk-shaped electrodes of substantially the same diameter as the disk-shaped single crystal, or ii) semicircular-shaped electrodes of substantially ½ diameter as the disk-shaped single crystal.

6. The piezoelectric structure of claim 3, the piezoelectric structure provides a displacement of about 55 nm/v at about 11 MHz alternating electric field.

7. The piezoelectric structure of claim 1, has a cross-section with a shape selected from the group consisting of square, rectangle, diamond, polygon, elliptical, and wheel-shaped.

8. The piezoelectric structure of claim 1, wherein the single crystal is $Pb(Mg_{1/3}Nb_{2/3})O_3$-$PbTiO_3$ (PMN-PT).

9. The piezoelectric structure of claim 1, wherein the single crystal has miller indices <011>.

10. A piezoelectric structure, comprising:
a substrate;
a single crystal having piezoelectric coefficients $d_{31}$ and $d_{32}$ of opposite magnitude formed on the substrate, such that when an alternating electric field is applied in the Z direction, the piezoelectric structure expands in one of the X and Y directions and contracts in the other of the X and Y direction, thereby generating torque resulting in displacement in the Z direction;
a first electrode coupled to the single crystal; and
a second electrode coupled to the single crystal, wherein the alternating electric field is input to the single crystal through the first and second electrodes, and wherein the crystal possesses piezoelectric coefficient $d_{31}$ of between about 1 pm/V and about 2500 pm/V and piezoelectric coefficient $d_{32}$ of between about −1 pm/V and −3500 pm/V.

11. The piezoelectric structure of claim 10, the single structure is disk-shaped.

12. The piezoelectric structure of claim 11, the disk-shaped single structure has a diameter of between about 10 μm and about 200 μm.

13. The piezoelectric structure of claim 11, wherein the disk-shaped single structure has a thickness of between about 1 μm and 10 μm.

14. The piezoelectric structure of claim 10, further comprising one or more anchors disposed i) center-axially coupled to substrate; ii) radially about the perimeter; or iii) a combination of i) and ii).

15. The piezoelectric structure of claim 12, the piezoelectric structure provides a displacement of about 1300 nm/volt at about 2.64 MHz alternating electric field.

16. The piezoelectric structure of claim 10, has a cross-section with a shape selected from the group consisting of square, rectangle, diamond, polygon, elliptical, and wheel-shaped.

17. The piezoelectric structure of claim 10, wherein the single crystal is $Pb(Mg_{1/3}Nb_{2/3})O_3$-$PbTiO_3$ (PMN-PT).

18. The piezoelectric structure of claim 10, wherein the single crystal has miller indices <011>.

* * * * *